US006894782B2

(12) United States Patent
Hoshino et al.

(10) Patent No.: US 6,894,782 B2
(45) Date of Patent: May 17, 2005

(54) METHOD OF MEASURING DEFOCUSING AND METHOD OF OBTAINING CORRECT FOCUSING

(75) Inventors: Daigo Hoshino, Kanagawa (JP); Takahiro Yamauchi, Miyagi-Prefecture (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/618,661

(22) Filed: Jul. 15, 2003

(65) Prior Publication Data

US 2004/0013957 A1 Jan. 22, 2004

(30) Foreign Application Priority Data

Jul. 16, 2002 (JP) ....................................... 2002-206653

(51) Int. Cl.[7] ................................................ G01B 11/00
(52) U.S. Cl. ....................................... 356/400; 430/327
(58) Field of Search .......................... 356/400; 430/327, 430/30

(56) References Cited

U.S. PATENT DOCUMENTS

| | | | | |
|---|---|---|---|---|
| 5,693,439 A | * | 12/1997 | Tanaka et al. | 430/30 |
| 5,792,596 A | * | 8/1998 | Yasuzato et al. | 430/327 |
| 5,856,053 A | | 1/1999 | Watanabe | |
| 6,608,681 B2 | * | 8/2003 | Tanaka et al. | 356/400 |

FOREIGN PATENT DOCUMENTS

| | | |
|---|---|---|
| WO | WO 95/10849 | 10/1994 |

* cited by examiner

*Primary Examiner*—John F. Niebling
*Assistant Examiner*—Andre' C. Stevenson
(74) *Attorney, Agent, or Firm*—Rabin & Berdo, P.C.

(57) ABSTRACT

There is provided a method of measuring defocusing when a semiconductor wafer is exposed to light. With the method, a resist is exposed to light by deviating a focus of the light by a given distance in relation to the semiconductor wafer with the resist applied thereto, and after development of the resist, resist patterns for measurement are formed. Based on respective lengths of the resist patterns for measurement, defocusing in relation to the resist is found.

11 Claims, 3 Drawing Sheets

103
104
100
102
A
B
Fm
F0
101

METHOD OF MEASURING DEFOCUSING AND METHOD OF OBTAINING CORRECT FOCUSING

BACKGROUND OF THE INVENTION

1. Field of the Invention

The invention relates to a method of measuring a defocusing distance of light shined on a semiconductor wafer when exposing the semiconductor wafer with a resist applied thereto to the light, and a method of obtaining correct focusing of the light shined on the semiconductor wafer. This application is a counterpart application of Japanese application, Serial Number 206653/2002, filed Jul. 16, 2002, the subject matter of which is incorporated herein by reference.

2. Description of the Related Art

When a semiconductor wafer with a resist applied thereto is exposed to light with the use of a pattern exposure system, exposure is implemented by focusing the light on the semiconductor wafer. In this case, the semiconductor wafer in a state as placed on a stage of the pattern exposure system is exposed to the light, and consequently, there occurs a delicate deviation in focus for respective regions (hereinafter referred to as respective shots) of the semiconductor wafer due to inclination of the stage or unevenness of the top surface of the semiconductor wafer, so that there is the need for obtaining correct focusing on a shot-by-shot basis.

In order to obtain correct focusing, it is necessary to measure a defocusing distance for every shot. In the past, the defocusing distance used to be measured with a focusing sensor attached to a pattern exposure system. Measurement of the defocusing distance by use of the focusing sensor has been made, for example, as follows; first, light passing through a first aperture fixedly disposed is shined on a semiconductor wafer. Subsequently, the light falling on, and reflected from the semiconductor wafer is shined on a second aperture fixedly disposed. Because an optical path of the light reflected varies depending on the position of the semiconductor wafer, the amount of light passing through the second aperture as well undergoes variation. A defocusing distance in respective shots of the semiconductor wafer, reflecting the light, is calculated from the amount of the light passing through the second aperture on the basis of the amount of light passing through the second aperture when the semiconductor wafer is at a focus position.

Correct focusing is achieved by adjusting the position of the stage on which the semiconductor wafer is placed on the basis of the defocusing distances found by use of the focusing sensor.

With a conventional method of measurement, however, it is difficult to examine in which way there has occurred a deviation in focus, upward or downward, if the deviation in focus is only slight.

It is therefore an object of the invention to provide a method of measuring a defocusing distance and a method of obtaining correct focusing, whereby such a problem as described can be resolved.

SUMMARY OF THE INVENTION

To that end, the invention provides a method of measuring defocusing, comprising the steps of applying a resist to the top surface of a semiconductor wafer, subjecting the resist to exposure to light by deviating a focus of the light by a given distance away from the resist, using a pattern exposure system, and by using a mask patterned in a geometrical figure comprising a plurality of small rectangles, each narrower in width than a resolution limit of the pattern exposure system, provided on four sides of a large rectangle, and arranged so as to be perpendicular longitudinally or parallel transversely to the respective four sides of the large rectangle, forming a resist pattern by developing the resist after the step of subjecting the resist to the exposure to light, and finding defocusing in relation to the resist on the basis of a length of the resist pattern.

BRIEF DESCRIPTION OF THE DRAWINGS

While the specification concludes with claims particularly pointing out distinctly claiming the subject matter that is regarded as the invention, the invention, along with the objects, features, and advantages thereof, will be better understood from the following description taken in connection with the accompanying drawings, in which;

DETAILED DESCRIPTION OF THE PREFERRED EMBODIMENTS

First Embodiment

Figure 1:
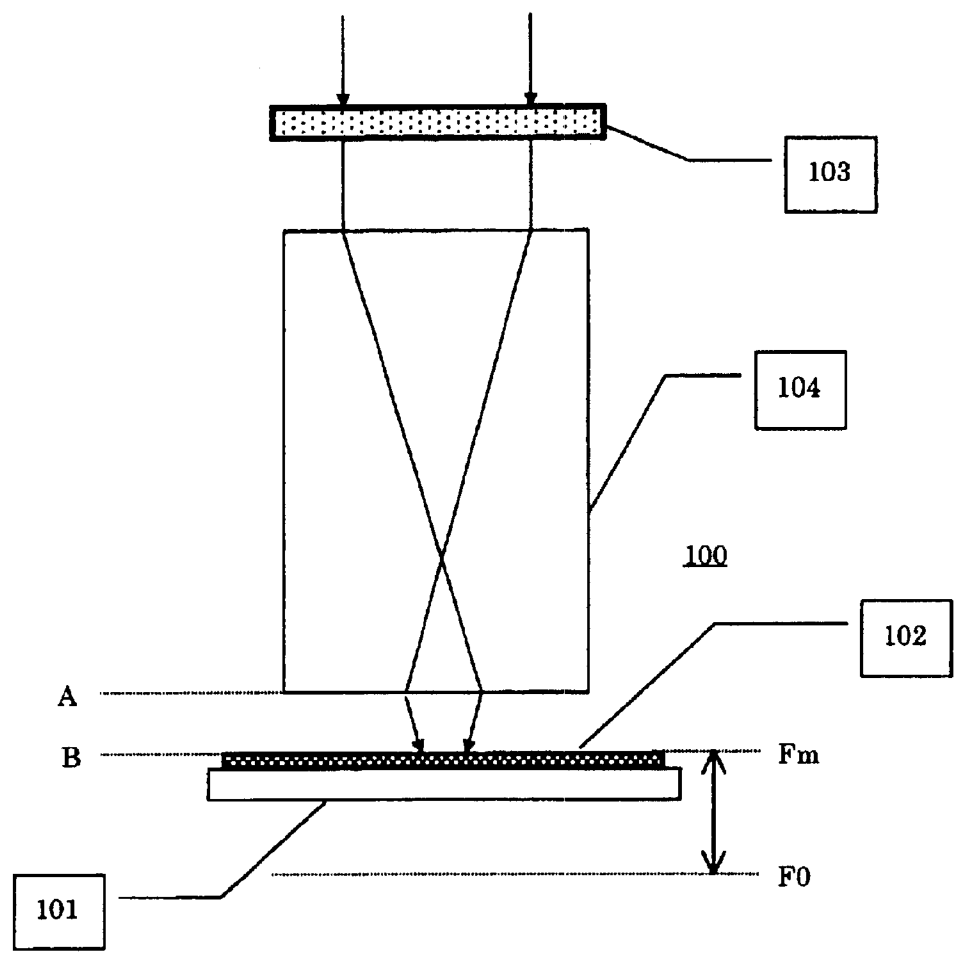
FIG. 1 is a side view of a pattern exposure system, showing a state where a semiconductor wafer is exposed to light by use of the pattern exposure system.
Figure 2:
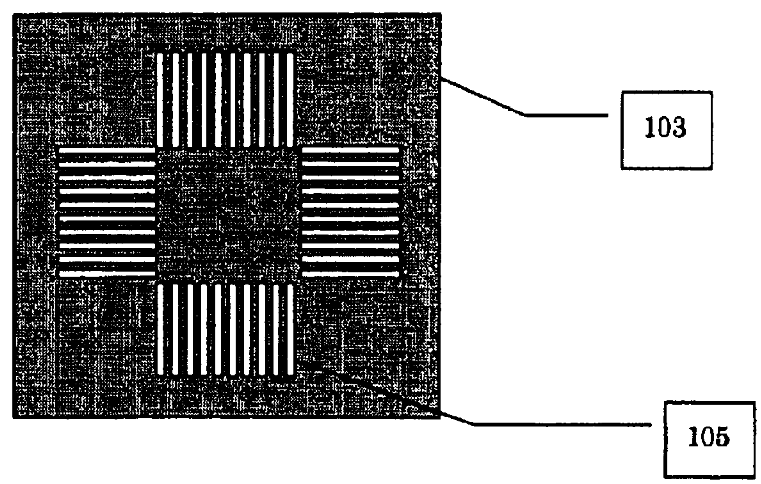
FIG. 2 is a top view showing measurement patterns formed in a photomask for use in carrying out the invention.
Figure 3A:
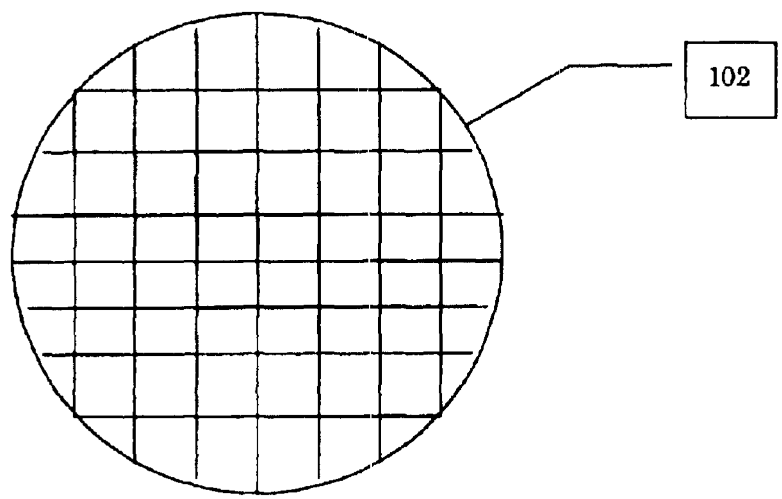
FIGS. 3(A) through 3(C) are top views and a sectional view, respectively, of the semiconductor wafer with a resist pattern for measurement, formed thereon.
Figure 3B:
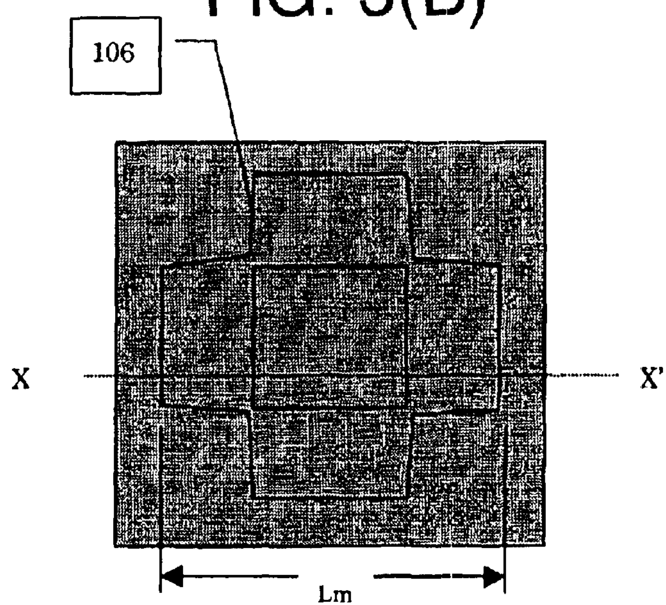
Figure 3C:
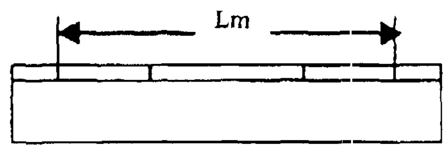
Figure 4:
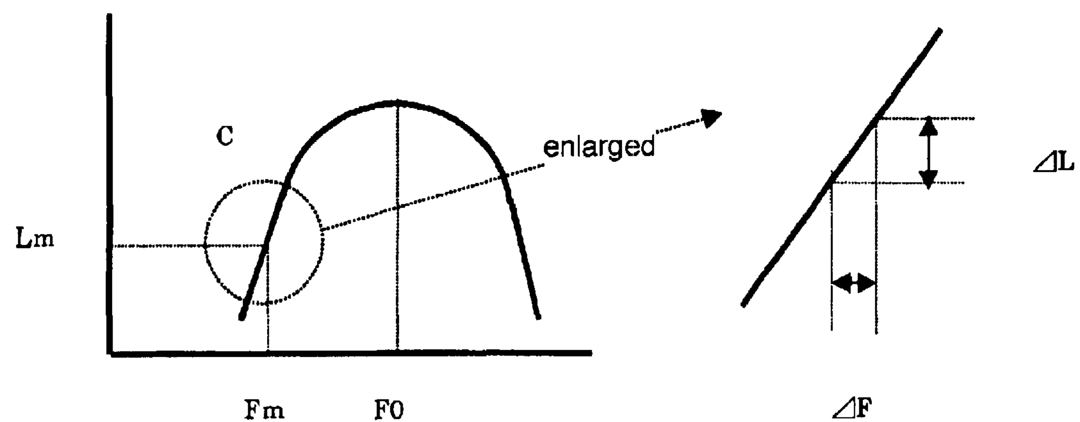
FIG. 4 is a graph showing a relationship of a defocusing distance at the time of exposure and a length of the resist pattern for measurement, formed by the exposure.

A first embodiment of the invention is concerned with a method of measuring a defocusing distance of light shined on a semiconductor wafer when exposing the semiconductor wafer with a resist applied thereto to the light. The first embodiment of the invention is described hereinafter with reference to FIGS. 1 to 4. FIG. 1 is a side view of a pattern exposure system, showing a state where a semiconductor wafer is exposed to light by use of the pattern exposure system. FIG. 2 is a top view of a photomask for use in exposure. FIGS. 3(A) through 3(C) are views of the semiconductor wafer after exposure, FIG. 3(A) being a top view showing the entire surface of the semiconductor wafer after exposure, FIG. 3(B) a partially enlarged view showing a part of FIG. 3(A), and FIG. 3(C) a sectional view taken on a dotted line X—X' in FIG. 3(B). FIG. 4 is a graph obtained by plotting a relationship of a length Lm of a resist pattern for measurement 106 after exposure, taken along the vertical axis, to a position Fm of the top surface of the semiconductor wafer 102, at the time of exposure, taken along the horizontal axis.

First, as shown in FIG. 1, a semiconductor wafer 102 with a resist applied thereto is set on top of a stage 101 of a pattern exposure system 100. Subsequently, the focus of the pattern exposure system 100 is deviated from the top surface of the semiconductor wafer 102 by adjusting the position of the stage 101, in the vertical direction, relative to a scale-down projective lens 104 fixedly attached to the pattern exposure system 100. A direction in which the focus is deviated is perpendicular to the top surface of the semiconductor wafer 102. More specifically, a distance between the lower end A of the reduction projective lens 104 and the top surface B of the semiconductor wafer 102 with the resist applied thereto is adjusted, thereby deviating the top surface B of the semiconductor wafer 102 to a point Fm away by a given distance from a focus position FO. In practice, since the resist has a thickness, optimum exposure is not always achieved when the focus position FO coincides with the top surface B of the semiconductor wafer 102. In order to achieve the optimum exposure, the focus position FO therefore needs to be set to any position between the top surface B of the semiconductor wafer 102 and the surface of the resist applied to the semiconductor wafer 102. Further, to which position in the direction of the thickness of the resist the focus position FO should be adjusted is dependent on a kind and thickness of the resist. It has so far been described that a base position where the optimum exposure can be achieved when set to the focus position FO is the top surface B of the semiconductor wafer 102, however, to be more accurate, such a base position will be any position between the top surface B of the semiconductor wafer 102 and the surface of the resist applied to the semiconductor wafer 102 as described in the foregoing. Furthermore, it is difficult to accurately define the position of the top surface of the semiconductor wafer 102 due to inclination of the stage 101, unevenness of the top surface of the semiconductor wafer 102, and so forth. For the sake of convenience, however, description will be given hereinafter for a while on the assumption that the base position where the optimum exposure can be achieved when set to the focus position FO is the top surface of the semiconductor wafer 102, and the top surface of the semiconductor wafer 102 is horizontally straight.

By shining light on the semiconductor wafer 102 through a photomask 103 and the scale-down projective lens 104 while causing the stage 101 to undergo translation, the semiconductor wafer 102 with the resist applied thereto is exposed to the light on a region-by-region (hereinafter referred to as shot-by-shot) basis.

Now, as shown in FIG. 2, the photomask 103 has measurement patterns 105 each comprising a plurality of small rectangles, each narrower in width than a resolution limit of the pattern exposure system 100, provided on four sides of a large rectangle, and arranged so as to be perpendicular longitudinally or parallel transversely to the respective fourides of the large rectangle. Accordingly, upon exposing the semiconductor wafer 102 with the resist applied thereto to the light by use of the photomask 103, latent images of respective measurement resist patterns are formed in the respective shots.

Subsequently, the resist with the respective latent images of the measurement resist patterns, formed therein, is developed, whereupon resist patterns for measurement 106, corresponding to the measurement patterns 105 of the photomask 103, respectively, are formed in the respective shots of the semiconductor wafer 102 as shown in FIG. 3. In this connection, since the pattern of the photomask 103 used at the time of exposure is patterned in a geometrical figure having the small rectangles narrower in width than the resolution limit of the pattern exposure system 100 as previously described, the resist patterns for measurement 106 as formed in the respective shots are not the same in shape as the pattern of the photomask 103, but appears in a shape as shown in FIG. 3(B). Subsequently, the length Lm of each of the resist patterns for measurement 106 is measured.

The exposure as previously described is carried out with the position of the stage 101, in the vertical direction, fixedly held, however, as previously described, due to the inclination of the stage 101, the unevenness of the top surface of the semiconductor wafer 102, and so forth, there occurs a delicate deviation in focus for every shot of the semiconductor wafer 102. Consequently, the position Fm of the top surface of the semiconductor wafer 102, at the time of exposure, delicately varies for every shot. It follows therefore that an extent of convergence of the light shined at the time of exposure will vary on a shot-by-shot basis, resulting in variation in the length Lm of each of the resist patterns for measurement 106 on a shot-by-shot basis.

The graph shown in FIG. 4 is obtained by plotting the relationship of the length Lm of the resist pattern for measurement 106 after exposure, taken along the vertical axis, to the position Fm of the top surface of the semiconductor wafer 102, at the time of exposure, taken along the horizontal axis. The graph undergoes little change in shape in the case of using the same pattern exposure system provided that the quality of the resist, the shape of the resist pattern, intensity of light for exposure, and exposure time are identical, respectively. As is evident from FIG. 4, in the case where the position Fm of the top surface of the semiconductor wafer 102, at the time of exposure, is in the vicinity of the focus position FO, a change in the length Lm of the resist pattern for measurement 106 is slight in relation to a change in the position Fm of the top surface of the semiconductor wafer 102.

However, in the case where the position Fm of the top surface of the semiconductor wafer 102, at the time of exposure, is in a region away to some extent from the focus position FO, for example, in the case of the position Fm of the top surface of the semiconductor wafer 102 being in a region C shown in FIG. 4, the length Lm of the resist pattern for measurement 106 linearly changes significantly in relation to a change in the position Fm of the top surface of the semiconductor wafer 102. Accordingly, a position of the stage 101 is adjusted at the time of exposure such that the position Fm of the top surface of the semiconductor wafer 102 comes to be in the vicinity of the region C.

Finally, by use of the graph in FIG. 4, the position Fm of the top surface of the semiconductor wafer 102, at the time of exposure, in the respective shots, is found on the basis of the length Lm of the resist pattern for measurement 106, formed in the respective shots. The position Fm of the top surface of the semiconductor wafer 102, at the time of exposure, in the respective shots, is obtained by adding or subtracting a given value from a defocusing distance in the respective shots.

Thus, with the first embodiment of the invention, even if defocusing is slight, a defocusing distance for every shot of a semiconductor wafer can be found as relative distribution, including a direction in which focusing is deviated, upward or downward.

However, since the defocusing distance obtained by use of the invention represents a value summing up a defocusing distance attributable to the semiconductor wafer and a defocusing distance attributable to the pattern exposure system, it is not possible with one-time-operation alone to determine whether the defocusing distance as measured by the method according to the invention is attributable to the pattern exposure system or the semiconductor wafer. In order to check the defocusing distance attributable to the pattern exposure system, there is the need for repeating the above-described operation several times using different wafers, thereby calculating the mean of the defocusing distances as obtained.

Second Embodiment

A second embodiment of the invention is concerned with a method of obtaining correct focusing of light shined on a semiconductor wafer when exposing the semiconductor wafer with a resist applied thereto to the light. The second embodiment of the invention is described hereinafter with reference to FIGS. 1 to 4. FIG. 1 is a side view of a pattern exposure system, showing a state where a semiconductor wafer is exposed to light by use of the pattern exposure system. FIG. 2 is a top view of a photomask for use in exposure. FIGS. 3(A) through 3(C) are views of the semiconductor wafer after exposure, FIG. 3(A) being a top view showing the entire surface of the semiconductor wafer after exposure, FIG. 3(B) a partially enlarged view showing a part of FIG. 3(A), and FIG. 3(C) a sectional view taken on a dotted line X—X' in FIG. 3(B). FIG. 4 is a graph obtained by plotting a relationship of the length Lm of a resist pattern for measurement 106 after exposure, taken along the vertical axis, to the position Fm of the top surface of the semiconductor wafer 102, at the time of exposure, taken along the horizontal axis. The method of obtaining correct focusing according to the second embodiment of the invention makes use of the method of measuring the defocusing distance according to the first embodiment of the invention.

First, as shown in FIG. 1, a semiconductor wafer 102 with a resist applied thereto is set on top of a stage 101 of a pattern exposure system 100. At this point in time, a focus position FO in relation to the semiconductor wafer 102 is decided upon. FO may be the mean focus position in relation to the semiconductor wafer 102, found from the turning point of the graph in FIG. 3. Otherwise, FO may be a focus position in a specific shot of the semiconductor wafer 102. Herein, explanation will be given on the assumption that FO is a focus position in a specific shot of the semiconductor wafer 102.

Subsequently, the position of a stage 101 is adjusted in the vertical direction such that the top surface of the semiconductor wafer 102, in specific shot where a focus position FO is decided upon, is deviated to a position Fm away by a given distance from the focus position FO.

Further, by shining light on the semiconductor wafer 102 through a photomask 103 and a scale-down projective lens 104 while causing the stage 101 to undergo translation, the semiconductor wafer 102 with the resist applied thereto is exposed to the light on a shot-by-shot basis. As with the first embodiment, use is made of the photomask 103 having measurement patterns 105 each comprising a plurality of small rectangles, each narrower in width than a resolution limit of the pattern exposure system 100, provided on four sides of a large rectangle, and arranged so as to be perpendicular longitudinally or parallel transversely to the respective fourides of the large rectangle, as shown in FIG. 2.

Thereafter, the resist after exposure is developed, whereupon the resist pattern for measurement 106 as shown in FIG. 3(B) is formed in the respective shots. Subsequently, the length Lm of the resist pattern for measurement 106 in the respective shots is measured. Steps of operation up to this point are identical to those for the first embodiment except that the focus position FO is decided upon in advance.

At the time of the exposure, the position of the stage 101, in the vertical direction, is fixedly held. However, since a delicate deviation in focus occurs on a shot-by-shot basis of the semiconductor wafer 102 due to the inclination of the stage 101, the unevenness of the top surface of the semiconductor wafer 102, and so forth, the position Fm of the top surface of the semiconductor wafer 102, at the time of exposure, delicately varies on a shot-by-shot basis. Consequently, the length Lm of the resist pattern for measurement 106 undergoes variation on a shot-by-shot basis. This step as well is the same as that for the first embodiment.

Subsequently, with the use of a length Lm1 of the resist pattern for measurement in a shot, a defocusing distance Fm1 in the shot is found by the following formula:

$$\text{defocusing distance } Fm1=Fm-FO+(\Delta F/\Delta L)\times(Lm1-Lm)$$

where FO is a focus position in a given shot, Lm is a length of the resist pattern for measurement 106 in the given shot, and Fm is a position of the top surface of the semiconductor wafer 102, at the time of exposure, in the given shot. Further, ΔF/ΔL represents variation of a defocusing distance against variation of the length Lm of the resist pattern for measurement 106. This corresponds to the reciprocal of an inclination of a straight line, found by linear approximation of a point on the graph (FIG. 4) obtained by plotting the relationship of the position Fm of the top surface of the semiconductor wafer 102, at the time of exposure, taken along the horizontal axis, to the length Lm of the resist pattern for measurement 106 formed by the exposure, taken along the vertical axis.

Finally, the position Fm of the top surface of the semiconductor wafer 102 is deviated by the defocusing distance Fm1 only as obtained from the focus position FO, thereby completing operation of obtaining correct focusing.

The second embodiment of the invention represents an application example where the first embodiment of the invention is applied to a method of obtaining correct focusing. With the second embodiment of the invention, the first embodiment of the invention is put to actual use for obtaining correct focusing, so that accurate focusing can be obtained with ease.

As described in the foregoing, with the present invention, defocusing is found on the basis of the shape of the resist pattern formed by exposure. Further, such exposure is carried out by deliberately deviating a focus position. Hence, it is possible to examine with ease defocusing including in which direction focusing is deviated, upward or downward.

What is claimed is:

1. A method of measuring defocusing, comprising the steps of:

applying a resist to the top surface of a semiconductor wafer;

subjecting the resist to exposure to light, wherein the exposure is carried out by deviating a focus of the light by a given distance away from the resist, in a direction perpendicular to the top surface of the semiconductor wafer, and by using a mask patterned with a geometrical figure comprising a plurality of small rectangles, each narrower in width than a resolution limit of a pattern exposure system, provided on four sides of a large rectangle, and arranged so as to be perpendicular longitudinally or parallel transversely to the respective four sides of the large rectangle;

forming a resist pattern by developing the resist after the step of subjecting the resist to the exposure to light; and finding defocusing in relation to the resist on the basis of a length of the resist pattern.

2. A method of measuring defocusing according to claim 1, wherein the exposure is carried out by focusing in a region where a ratio of change in the shape of the resist pattern, to change in the position of the focus, is linear.

3. A method of obtaining correct focusing, comprising the steps of:

applying a resist to the top surface of a semiconductor wafer, having a plurality of shots;

measuring a focus position in relation to the resist;

subjecting the respective shots of the resist to exposure to light by deviating a focus by a given distance away from the focus position, in a direction perpendicular to the top surface of the semiconductor wafer, wherein the exposure is carried out by deviating the focus by a given distance away from the resist, in the direction perpendicular to the top surface of the semiconductor wafer, and by using a mask patterned with a geometrical figure comprising a plurality of small rectangles, each narrower in width than a resolution limit of a pattern exposure system, provided on four sides of a large rectangle, and arranged so as to be perpendicular longitudinally or parallel transversely to the respective four sides of the large rectangle;

forming a resist pattern for the respective shots by developing the resist after the step of subjecting the respective shots of the resist to the exposure to light;

finding defocusing in relation to the focus position in the respective shots on the basis of a size of the resist pattern for the respective shots; and executing focusing in relation to the resist on the basis of the focus position and the defocusing.

4. A method of obtaining correct focusing, wherein the exposure is carried out by focusing in respective regions where a ratio of change in the shape of the resist pattern, to change in the position of the focus, is linear.

5. A method of measuring defocusing according to claim 1, wherein the step of subjecting the resist to exposure to light comprises using the pattern exposure system to focus the geometrical figure on an image plane that is approximately parallel to the top surface of the semiconductor wafer.

6. A method of measuring defocusing according to claim 3, wherein the step of subjecting the respective shots of the resist to exposure to light comprises using the pattern exposure system to focus the geometrical figure on an image plane that is approximately parallel to the top surface of the semiconductor wafer.

7. A method of measuring defocusing, comprising the steps of:

applying a resist to the top surface of a semiconductor wafer;

placing a mask patterned with a predetermined figure in a pattern exposure system having a resolution limit, the predetermined figure including a plurality of elongated light-transmitting regions each having a width that is narrower than the resolution limit of the pattern exposure system, the pattern exposure system including focusing means for projecting an image of the predetermined pattern in a plane, the focusing means having an optical axis;

positioning the wafer with respect to the pattern exposure system so that the optical axis of the focusing means is substantially perpendicular to the semiconductor wafer and the image plane is located below the resist;

exposing the resist with light projected by the pattern exposure system;

developing the resist to form a resist pattern on the semiconductor wafer;

measuring the resist pattern; and finding defocusing using the measurement of the resist pattern.

8. A method of measuring defocusing according to claim 7, wherein the elongated light-transmitting regions include narrow stripes that are disposed parallel to one another.

9. A method of measuring defocusing according to claim 7, wherein the predetermined pattern includes a rectangle and the elongated light transmitting regions include a first set of narrowstripes that are disposed parallel to one another and perpendicular to a first side of the rectangle, and a second set of narrow stripes that are disposed parallel to one another and perpendicular to a second side of the rectangle.

10. A method of measuring defocusing according to claim 9, wherein the first and second sides are opposite sides of the rectangle.

11. A method of measuring defocusing according to claim 10, wherein the elongated light transmitting regions additionally include a third set of narrow stripes that are disposed parallel to one another and perpendicular to a third side of the rectangle, and a fourth set of narrow stripes that are disposed parallel to one another and perpendicular to a fourth side of the rectangle.

* * * * *